United States Patent [19]

Drekmeier et al.

[11] Patent Number: 4,907,125
[45] Date of Patent: Mar. 6, 1990

[54] CIRCUIT MODULE INCLUDING A PLATE-SHAPED CIRCUIT CARRIER OF GLASS OR CERAMIC

[75] Inventors: Karl-Gerd Drekmeier, Unterhaching; Gerhard Winter, Munich, both of Fed. Rep. of Germany

[73] Assignee: Siemens Aktiengesellschaft, Berlin and Munich, Fed. Rep. of Germany

[21] Appl. No.: 200,244

[22] Filed: May 31, 1988

[30] Foreign Application Priority Data

Jul. 3, 1987 [DE] Fed. Rep. of Germany ....... 3722119

[51] Int. Cl.$^4$ ............................................... H05K 7/20
[52] U.S. Cl. .................................... 361/386; 165/185; 174/16.3; 357/81; 361/388; 361/401
[58] Field of Search ................. 165/80.3, 185; 357/80, 357/81; 361/386-389, 400, 401, 414; 174/16.3

[56] References Cited

U.S. PATENT DOCUMENTS

| | | | |
|---|---|---|---|
| 4,025,997 | 5/1977 | Gernitis et al. | 428/621 |
| 4,648,008 | 3/1987 | Neyroud et al. | 361/387 |
| 4,689,719 | 8/1987 | Prussas et al. | 361/386 |

FOREIGN PATENT DOCUMENTS

| | | |
|---|---|---|
| 0236739 | 9/1987 | European Pat. Off. |
| 2511193 | 2/1983 | France |
| 58-135658 | 8/1983 | Japan |

OTHER PUBLICATIONS

"Copper-Clad Invar Heatsink", IBM Technical Disclosure Bulletin, vol. 27, No. 11, 4/85, p. 6382.

Primary Examiner—Gregory D. Thompson
Attorney, Agent, or Firm—Hill, Van Santen, Steadman & Simpson

[57] ABSTRACT

A metal plate is connected over a large area to one side of a glass or ceramic substrate for good heat distribution and removal. The metal plate consists of three layers, namely two outer copper layers and a center Invar layer having the thickness ratio of the layers of approximately 20:60:20. As a result of such a selected thickness ratio, the metal plate exhibits approximately the same coefficient of thermal expansion as the substrate and an inadmissible bending of the substrate or overstressing of the solder or adhesive line between the substrate and metal plate is prevented.

6 Claims, 2 Drawing Sheets

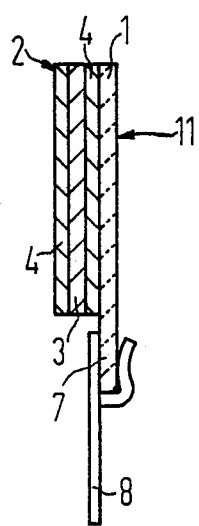
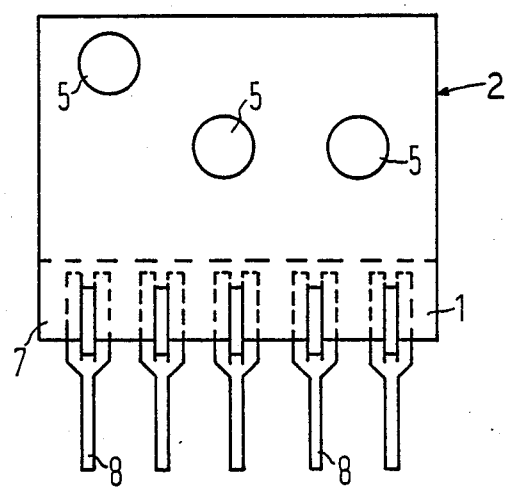
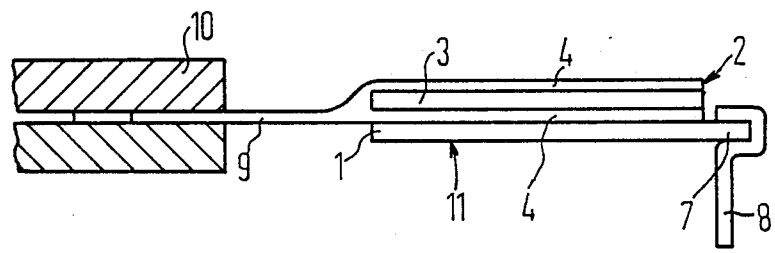

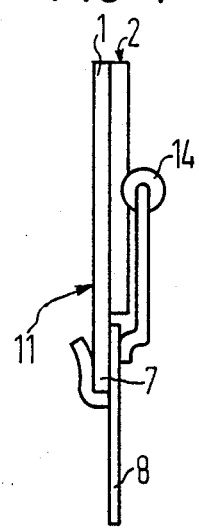
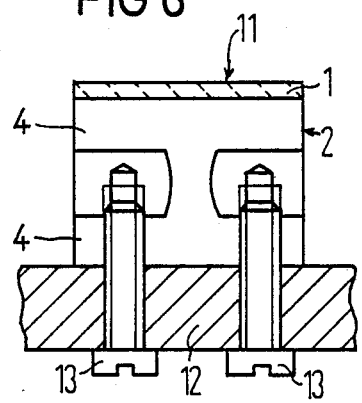
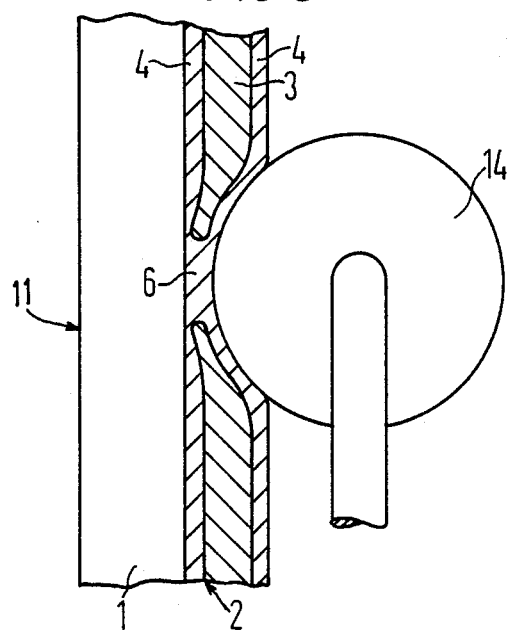

CIRCUIT MODULE INCLUDING A E-SHAPED CIRCUIT CARRIER OF GLASS OR CERAMIC

BACKGROUND OF THE INVENTION

Field of the Invention

The present invention relates to a circuit module including a plate-shaped circuit carrier of glass or ceramic and having a metal plate which is connected over a large area to one side of the circuit carrier. The metal plate is constructed as a three-layer plate having two outer layers of essentially the same thickness which consist, in each case, of a metal with good thermal conductivity, or a metal alloy with good thermal conductivity. The center layer of the metal plate constructed from a material having a much poorer thermal conductivity compared with the conductivity of the two outer layers. The coefficients of thermal expansion of the layers are matched in such a manner that the resultant coefficient of the three-layer plate largely corresponds to the coefficient of thermal expansion of the circuit carrier.

2. Description of the Prior Art

The aforementioned construction of a circuit module provides the advantageous possibility of constructing the metal plate to be relatively thick thereby making it suitable for removing relatively large quantities of heat without, as a result, shear forces occurring between the circuit carrier and the metal plate. As has heretofore been the case, such shear forces cause the adhesive or solder bond between the metal plate and the circuit carrier to tear. Moreover, when the area of the metal plates is increased in order to remove large amounts of heat, the outer metallic conductive layer is not adequately involved in the heat transport.

SUMMARY OF THE INVENTION

It is therefore the object of the present invention to improve the construction of a module of the type set forth above with respect to the heat transport capability.

In order to achieve the above object, and in accordance with the present invention, the three-layer plate is provided with openings in the center layer so that the two outer layers may be integrally joined to one another in the area of these openings.

Since two outer layers of the metal plate are integrally joined to one another in the area of openings of the center layer, the heat exchange therebetween may be considerably improved. Thus, the layer resting directly on the circuit carrier and the other outer layer of the three-layer plate, which also has good thermal conductivity, may exchange heat thereby increasing the effective heat dissipation of a metal plate having a relatively large area.

In this connection, it is particularly advantageous that the two outer layers of the three-layer plate consists of copper and the center layer consists of Invar.

Copper is a particularly good heat conductor. The relatively large coefficient of thermal expansion of copper is compensated by the very low coefficient of thermal expansion of Invar so that the three layer plate overall has a coefficient which largely corresponds to the coefficient to thermal expansion of the circuit carrier.

It can also be provided that the thickness ratio of the layers of the three-layer plate is about 20:60:20.

This thickness ratio has been found to be particularly advantageous in the case of the three-layer plate consisting of copper and Invar.

The outer layer of the three-layer plate directly resting against the circuit carrier may be extended past the area of the circuit carrier. The other outer layer of the three-layer plate may then be integrally joined to the outer layer extending past the circuit carrier.

Such an extension and integral joining of the outer layers thereat creates a heat conduction path which is in particularly intimate thermal contact with the circuit carrier. Additionally, the extension can be connected, for example, to a separate heat sink, or for mechanically fixing the circuit module to a housing or rack wall.

Finally, it can also be provided that the three-layer plate is provided with holes for screwing in screws perpendicularly to the plane of the circuit carrier. Furthermore, a recess may be located in at least one of the areas opened in the center layer on the side of the three-layer plate facing away from the circuit carrier. A thermally highly-stressed component or a fuse is inserted into the recess in the three-layer plate; the recess being formed to accept this component body.

The screws can be used for attaching the circuit module to a rack or housing wall, in which arrangement the screws form additional thermal conductors between the circuit module and the housing or rack. Insertion of the fuse body into the recess area of the three-layer plate in which the two outer layers are integrally joined to one another, makes it possible to arrange the fuse at a location which is particularly suitable for the fuse to be optimally utilized.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 1 is a cross sectional view taken through a circuit module constructed in accordance with the present invention;

FIG. 2 is a side view of the circuit module constructed in accordance with the present invention;

FIG. 3 is a front view of a circuit module constructed in accordance with the present invention;

FIG. 4 illustrates how a fuse is arranged in an opening of the center layer of the three layer plate;

FIG. 5 is an enlarged view of the structure of FIG. 4, shown partially in section; and FIG. 6 illustrates how a circuit module is attached to a rack or housing wall by way of screws which are screwed into the three layer plate.

DESCRIPTION OF THE PREFERRED EMBODIMENTS

In detail, the drawings illustrate that a plate-shaped circuit carrier 1 of ceramic is connected by bonding or soldering (not shown) over a large area of a three-layer plate 2. The three-layer plate 2 comprises a center Invar layer 3 and two outer copper layers 4. One of the two copper layers 4 is directly adjacent to a circuit carrier 1, while the other copper layer 4 is located on the side of the Invar layer 3 facing away from the circuit carrier 1. With the thickness ratio of the copper layers and of the Invar layer of approximately 20:60:20, a coefficient of thermal expansion of the three-layer plate 2 is obtained which largely corresponds to that of the circuit carrier 1. In consequence, the three-layer plate 2 can be constructed to be relatively thick without the bond between the three-layer plate and the circuit carrier 1 being overstressed in the event of temperature fluctuations. In addition, no inadmissibly large warping of the circuit carrier 1 occurs in such a circuit module.

On the side of the circuit carrier 1 facing away from the three-layer plate 2, the circuit carrier can be equipped with components 5 (FIG. 3). Such components frequently represent concentrated heat sources, the heat of which must be removed in order to avoid local overheating which may destroy the components. The required heat removal is effected by the copper layer 4 of the three-layer plate 2 which is directly adjacent to the circuit carrier, whereas the other copper layer 4, which is located on the side of the Invar layer 3 facing away from the circuit carrier 1, is mainly used for preventing a bimetallic behavior of the copper layer adjacent to the circuit carrier 1 and of the Invar layer connected to this copper layer.

FIG. 5 illustrates that the outer copper layer can also be used for heat removal by way of an opening 6 in the Invar layer 3 and by means of an integral joining of the two copper layers 4 in the area of such an opening 6. While FIG. 5 illustrates only one opening, it should be understood that more than one such opening may be employed.

An opening 6 with copper layers joined in the area thereof is respectively and optimally placed wherever a heat generating component 5 is arranged on the heat generating component side 11 of the circuit carrier.

FIGS. 1 and 3 illustrate that the three-layer plate 2 does not extend along the entire surface of the circuit carrier 1, thus leaving an edge zone 7 of the circuit carrier 1 uncovered. The edge zone 7 of the circuit carrier 1 has connecting elements 8 attached thereto in a clamp-like manner on both sides thereof.

FIG. 2 illustrates that the copper layer 4 directly adjacent to the circuit carrier 1 is preferably extended past the circuit carrier 1 on a side of the three-layer plate 2 facing away from the edge zone 7. Such an extension 9 may be placed in intimate thermal contact, for example, with a heat sink 10 which has ribs (not shown). The extension 9 can also be used for mechanically attaching the circuit module consisting of the circuit carrier 1 and the three-layer plate 2 to a housing or rack. FIG. 2 also illustrates that the other copper layer 4 can be integrally joined, on the side of the extension 9, to the copper layer 4 adjacent to the circuit carrier 1, which further favors the heat transport between the three-layer plate 2 and the heat sink 10.

FIG. 6 shows that the circuit module consisting of the circuit carrier 1 and the three-layer plate 2, together with the components which may be provided on a component side 11 of the circuit carrier 1, can be connected to a rack or housing wall 12 by way of screws 13 which have been screwed into the relatively-thick three-layer plate 2 perpendicularly to the plane of the circuit carrier 1.

FIGS. 4 and 5 show that the body 14 of a fuse or of a thermally-high-stressed component can be inserted in the area of an opening 6 of the Invar layer 3 into a recess in the three-layer plate 2 which is formed to accept a portion of the body 14 therein. The body 14 is thereby placed in particularly intimate thermal contact with both of the layers 4 and with the component respectively arranged on the component side 11 of the circuit carrier 1 at the location of the opening 6. A temperature rise caused by a defect of the component leads to a rapid heating of the fuse body thereby tripping the fuse before the component defect results in further damage.

Although we have described our invention by reference to a particular illustrative embodiment thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A circuit module comprising:
   a plate-shaped circuit carrier;
   a metal plate connected over a large area of one side of said circuit carrier;
   said metal plate having a three-layer structure including two outer layers each consisting of metal of a good thermal conductivity and a center layer sandwiched therebetween consisting of a material having a lesser thermal conductivity than the thermal conductivity of the two outer layers, one of said outer layers spaced from said circuit carrier and having a recess, the other of said outer layers located proximate said circuit carrier;
   said two outer layers having substantially the same thickness and the coefficients of thermal expansion of the outer layers and inner layer being matched such that the resultant coefficient of the metal plate substantially corresponds to the coefficient of thermal expansion of the circuit carrier;
   said metal plate having openings in the center layer;
   said two outer layers being integrally joined to one another through said openings in said center layer; and
   a thermally-high-stressed component located in said recess in said one of said outer layers spaced from said circuit carrier, said recess disposed substantially in registry with one of said openings in said center layer.

2. The circuit module of claim 1, wherein:
   said two outer layers of said three-layer plate consist of copper and the center layer consists of Invar.

3. The circuit module of claim 2, wherein:
   the thickness ratio of said layers is approximately 20:60:20.

4. The circuit module of claim 1, wherein:
   said other of said two outer layers is bonded to said circuit carrier, said other of said two outer layers having an extension beyond the area of said circuit carrier.

5. The circuit module of claim 4, wherein:
   said one of said two outer layers is joined at the extension thereof to said other outer layer of said two outer layers.

6. The circuit module of claim 1, wherein:
   said metal plate comprises holes, each of the holes having its respective axis lying perpendicularly to the plane of said circuit carrier for accepting screws therein.

* * * * *